United States Patent [19]
Ishii et al.

[11] Patent Number: 5,972,495
[45] Date of Patent: Oct. 26, 1999

[54] ALUMINA COATED TOOL AND PRODUCTION METHOD THEREOF

[75] Inventors: Toshio Ishii; Masayuki Gonda, both of Saitama-ken; Hiroshi Ueda, Chiba-ken; Tsunehiro Kawata, Saitama-ken, all of Japan

[73] Assignee: Hitachi Metals, Ltd., Tokyo, Japan

[21] Appl. No.: 08/887,175

[22] Filed: Jul. 2, 1997

[30] Foreign Application Priority Data

Jul. 3, 1996 [JP] Japan ..................................... 8-192795

[51] Int. Cl.[6] .................................................. B23B 27/14
[52] U.S. Cl. .......................... 428/325; 428/323; 428/336; 428/698; 428/701; 428/702; 51/307; 51/309
[58] Field of Search ...................... 51/307, 309; 428/336, 428/698, 701, 702, 323, 325

[56] References Cited

U.S. PATENT DOCUMENTS

| | | | |
|---|---|---|---|
| 5,372,873 | 12/1994 | Yoshimura et al. | 428/216 |
| 5,487,625 | 1/1996 | Jungberg et al. | |
| 5,635,247 | 6/1997 | Ruppi | 427/348 |
| 5,652,045 | 7/1997 | Nakamura et al. | 428/698 |
| 5,705,263 | 1/1998 | Lenander et al. | 428/336 |

FOREIGN PATENT DOCUMENTS

| | | |
|---|---|---|
| 0403461 | 12/1990 | European Pat. Off. . |
| 0603144 | 6/1994 | European Pat. Off. . |
| 0685572 | 12/1995 | European Pat. Off. . |
| 0709484 | 5/1996 | European Pat. Off. . |
| 0736615 | 10/1996 | European Pat. Off. . |
| 0753603 | 1/1997 | European Pat. Off. . |
| 63-195268 | 8/1988 | Japan . |
| 230406 | 1/1990 | Japan . |
| 5345976 | 12/1993 | Japan . |

*Primary Examiner*—Archene Turner
*Attorney, Agent, or Firm*—Sughrue, Mion, Zinn, Macpeak & Seas, PLLC

[57] ABSTRACT

An alumina coated tool comprising a plurality of refractory layers and a substrate body. The refractory layers comprise a non-oxide layer on the surface of the substrate body, a bonding layer having a face-centered-cubic structure on the non-oxide layer, and an oxide layer on the bonding layer. The non-oxide layer is at least one of carbide, nitride and carbonitride of a metal selected from the group consisting of the Groups IVa, Va and VIa of the Periodic Table. The bonding layer is a single- or multi-coating of oxide, oxycarbide, oxynitride, oxycarbonitride of a metal selected from the group consisting of the Groups IVa, Va and VIa of the Periodic Table. The oxide layer is substantially $\alpha\text{-}Al_2O_3$. The epitaxial relationship between the non-oxide layer and the bonding layer enhances the bonding strength of the oxide layer to provide an alumina coated tool resistant to flaking of the oxide layer.

6 Claims, 6 Drawing Sheets

OXIDE LAYER

BONDING LAYER

NON-OXIDE LAYER

|—— 1.5 μm ——|

OXIDE LAYER

BONDING LAYER

NON-OXIDE LAYER

|—— 600 nm ——|

5 nm 5 nm

OXIDE LAYER

BONDING LAYER

NON-OXIDE LAYER 1.5 μm

OXIDE LAYER

BONDING LAYER

NON-OXIDE LAYER 600 nm

ALUMINA COATED TOOL AND PRODUCTION METHOD THEREOF

BACKGROUND OF THE INVENTION

The present invention relates to a wear-resistant alumina coated tool for use in cutting tools, etc., which is excellent in a resistance to coat-flaking, and also relates to a production method thereof.

Generally, a coated tool is produced by forming a hard coating on the surface of a substrate body made of a cemented carbide, a high speed steel, a special steel, etc. by the chemical vapor deposition or the physical vapor deposition. The coated tool has found wide practical applications because of having both the wear resistance resulting from the hard coating and the toughness resulting from the substrate body. Since the cutting edge of the cutting tools reaches about 1000° C. particularly during the machining of a highly hard material at a high cutting speed, and the cutting tools subjected to wear due to contacting with the workpiece materials and an intermittent mechanical shock, the coated tools having both the wear resistance and the toughness have been found useful.

The hard coating is a single layer or multilayer structure of a non-oxide coating having a high wear resistance and toughness, or an oxide coating having a good oxidation resistance. The non-oxide coating may be carbide, nitride, carbonitride of a metal selected from the Groups IVa, Va and VIa of the Periodic Table such as TiN, TiC and TiCN, and an oxide coating may be $\alpha$-$Al_2O_3$, $\kappa$-$Al_2O_3$, etc.

The main disadvantage of the non-oxide coating comprising the carbide, nitride, carbonitride, etc., is its particular sensitivity to oxidation. To minimize the oxidation of the non-oxide coating layer, there has been proposed a multi-layered structure in which an oxide coating such as alumina having a good oxidation resistance is coated on the non-oxide coating. However, the non-oxide/oxide multi-layered structure is low in the bonding strength between the non-oxide coating and the oxide coating and unstable in the mechanical strength at a higher temperature.

Although, $\kappa$-$Al_2O_3$ layer is tightly bonded to the non-oxide layer and formed at relatively low temperature of 1000 to 1020° C., the cracking in the coating layer and the flaking or removal of the $\kappa$-$Al_2O_3$ coating layer from the coated body frequently occur during the machining operation at a high temperature because of the volume change caused by the phase transfer from the metastable $\kappa$-$Al_2O_3$ to the stable $\alpha$-$Al_2O_3$.

On the other hand, $\alpha$-$Al_2O_3$ is stable at a high temperature and has a good oxidation resistance and high temperature property. However, the formation of $\alpha$-$Al_2O_3$ coating directly on the non-oxide layer requires a high temperature of about 1040° C. or higher which makes the $\alpha$-$Al_2O_3$ grains coarser with a grain size of 1 to 6 $\mu$m, this resulting in micropores and crystallographic defects to reduce the mechanical strength of the alumina coating. Also, when exposed to a high temperature, the property of the non-oxide layer is likely to be deteriorated, for example, due to the diffusion of W and/or Co, etc.

To eliminate the problem of the high formation temperature, the conventional technique has proposed that the surface of the non-oxide coating is first oxidized to form an oxidized layer and then the $\alpha$-$Al_2O_3$ coating is formed on the oxidized layer at a relatively low temperature of 1000 to 1020° C. However, the $\alpha$-$Al_2O_3$ coating formed by such a method is insufficient in the bonding strength with the non-oxide layer, and still suffers from the fast flaking or removal of the $\alpha$-$Al_2O_3$ coating from the non-oxide under coating during the cutting operation.

To improve the bonding strength between the oxide coating mainly comprising $\alpha$-$Al_2O_3$ and the non-oxide under coating, several methods have been proposed. Japanese Patent Laid-Open No. 63-195268 has proposed a method in which TiCNO coating of 0.5 $\mu$m thick is first formed at 1100° C. or 1030° C. and then the alumina layer is formed thereon at 960° C. or 1000° C. Japanese Patent Laid-Open No. 2-30406 has proposed to form the alumina layer on TiCO or TiCNO coating of 1 $\mu$m thick. Japanese Patent Laid-Open No. 5-345976 has proposed to form the alumina layer at 1000° C. on TiCNO or TiCO coating of 0.5 or 3 $\mu$m thick having a grain size of 0.2 to 1.5 $\mu$m formed at 1000° C. by using $TiCl_4$, CO, $H_2$, and $N_2$ gas. U.S. Pat. No. 5,487,625 has disclosed a method in which a substrate body is coated with a layer of TiCNO and then the layer of $\alpha$-$Al_2O_3$ is deposited thereon by carefully controlling the oxidation potential of the hydrogen carrier gas below 20 ppm of $H_2O$ prior to the nucleation of $Al_2O_3$. The nucleation of $Al_2O_3$ is started by sequentially adding the reacting gases in the order of $CO_2$, CO and $AlCl_3$ while keeping the temperature at about 1000° C. during the nucleation.

However, the bonding strength between the alumina layer and the non-oxide under coating is still insufficient in the coating structure obtained by the above proposed methods.

OBJECT AND SUMMARY OF THE INVENTION

Accordingly, an object of the present invention is to provide an alumina coated tool having an improved bonding strength between the alumina layer and the non-oxide under layer.

The inventors have investigated in detail the problem of the flaking and the removal of the oxide layer mainly comprising $\alpha$-$Al_2O_3$ from the non-oxide layer. Several cutting tools having on a substrate body such as a cemented carbide a multilayer structure containing the $\alpha$-$Al_2O_3$ layer and the non-oxide under layer were tested with respect to the flaking or removal of the $\alpha$-$Al_2O_3$ layer during the cutting operation. As a result of the close examination of the flaked or exfoliated portions, it was seen that the exfoliation of the oxide layer of $\alpha$-$Al_2O_3$ occurred at the interfacial portion of the oxide layer of $\alpha$-$Al_2O_3$ and the non-oxide under layer, and the inventors have found that the mechanical strength of a bonding layer present between the oxide layer and the non-oxide under layer and the adhering quality of the bonding layer to both the oxide layer and the non-oxide under layer are of particular importance for preventing the oxide layer from being flaked or exfoliated.

The bonding layer is usually formed by oxidizing the surface of the non-oxide coating layer of TiC, TiCN, etc. with the use of a mixed gas of $H_2O$ and $CO_2$. The bonding layer mainly comprises $Ti_2O_3$ (ASTM No. 10-63), $Ti_3O_5$ (ASTM No. 11-217) and $TiO_2$ (ASTM No. 21-1276) according to the oxidation conditions, each respectively being trigonal system, monoclinic system and rutile structure. However, the bonding layer having such crystal structures shows a low bonding strength to the non-oxide under layer and has a poor mechanical strength due to brittle nature. If the oxidation of the surface of the non-oxide layer of TiC, TiN, TiCN, etc. to $Ti_2O_3$, $Ti_3O_5$, $TiO_2$, etc. is insufficient, $\kappa$-$Al_2O_3$ coating is dominantly formed in place of $\alpha$-$Al_2O_3$ coating during the $Al_2O_3$ deposition at 1020° C. or lower to prevent the formation of the $\alpha$-$Al_2O_3$ coating having good high-temperature characteristics. Although, $\alpha$-$Al_2O_3$ may be dominantly deposited at a temperature higher than 1020° C., the high deposition temperature makes the grains in the $\alpha$-$Al_2O_3$ layer coarser in its size to reduce the properties of the resulting coated tools.

In the formation of the bonding layer of TiCO, TiCNO, etc. directly on the non-oxide layer, the inventors have found that the oxygen content in the bonding layer was undesirably high when an excess amount of the oxidizing gas such as $CO_2$, $H_2O$, etc. was used and/or the oxidation temperature was too high. The high content of oxygen reduced the bonding strength of the bonding layer to the non-oxide under layer and the mechanical strength of the bonding layer. When CO gas was used in place of $CO_2$ gas, the oxygen content in the bonding layer was insufficient, thereby preventing the stable formation of the oxide coating of $\alpha$-$Al_2O_3$. Also, it was found that the bonding layer has a poor mechanical strength to result in fracture when the thickness thereof was too large and the grains therein was too large in size.

As a result of the above close examination, the inventors have found that the conventional problem of an insufficient bonding strength of the oxide layer mainly comprising $\alpha$-$Al_2O_3$ to the non-oxide under layer of TiN, TiCN, TiC, etc. can be solved by improving the properties, in particular, crystallographical properties of the bonding layer formed between the oxide layer and the non-oxide layer.

Thus, in a first aspect of the present invention, there is provided an alumina coated tool having a plurality of refractory layers on a substrate body, wherein the plurality of refractory layers comprises: (1) a non-oxide layer of at least one of carbide, nitride and carbonitride of a metal selected from the group consisting of the Groups IVa, Va and VIa of the Periodic Table, the non-oxide layer being deposited on a surface of the substrate body; (2) a bonding layer having a face-centered-cubic structure and comprising a single-coating or a multi-coating of at least one of oxide, oxycarbide, oxynitride, oxycarbonitride of a metal selected from the group consisting of the Groups IVa, Va and VIa of the Periodic Table, the bonding layer being deposited on the non-oxide layer; and (3) an oxide layer being substantially $\alpha$-$Al_2O_3$, the oxide layer being deposited on the bonding layer.

In a second aspect of the present invention, there is provided a method of producing an alumina coated tool, which comprises: (1) forming a non-oxide layer of at least one of carbide, nitride and carbonitride of a metal selected from the group consisting of the Groups IVa, Va and VIa of the Periodic Table on a surface of a substrate body; (2) forming on the non-oxide layer a face-centered-cubic bonding layer comprising a single-coating or a multi-coating of at least one of oxide, oxycarbide, oxynitride, oxycarbonitride of a metal selected from the group consisting of the Groups IVa, Va and VIa of the Periodic Table at 950 to 1020° C. by bringing a gas mixture into contact with the non-oxide layer, the gas mixture comprising a gas mixture used for forming the non-oxide layer and $CO_2$ gas added thereto in an amount of 0.5 to 1.5 volume % based on the gas mixture for forming the non-oxide layer; and (3) forming on the bonding layer an oxide layer which is substantially $\alpha$-$Al_2O_3$.

In a third aspect of the present invention, there is provided a method of producing an alumina coated tool, which comprises: (1) forming a non-oxide layer of at least one of carbide, nitride and carbonitride of a metal selected from the group consisting of the Groups IVa, Va and VIa of the Periodic Table on a surface of a substrate body; (2) forming on the non-oxide layer a face-centered-cubic bonding layer comprising a single-coating or a multi-coating of at least one of oxide, oxycarbide, oxynitride, oxycarbonitride of a metal selected from the group consisting of the Groups IVa, Va and VIa of the Periodic Table by bringing the non-oxide layer into contact with a gas mixture used for forming the non-oxide layer at 950 to 1020° C. for 1 to 10 minutes after adding one gas component thereto, and further with the gas mixture containing additional one component at 950 to 1020° C. for 1 to 30 minutes after adding $CO_2$ gas in an amount of 0.5 to 1.5 volume % based on the gas mixture containing additional one component; and (3) forming on the bonding layer an oxide layer which is substantially $\alpha$-$Al_2O_3$.

In a fourth aspect of the present invention, there is provided a method of producing an alumina coated tool, which comprises: (1) forming a non-oxide layer of at least one of carbide, nitride and carbonitride of a metal selected from the group consisting of the Groups IVa, Va and VIa of the Periodic Table on a surface of said substrate body; (2) forming on said non-oxide layer a face-centered-cubic bonding layer comprising a single-coating or a multi-coating of at least one of oxide, oxycarbide, oxynitride, oxycarbonitride of a metal selected from the group consisting of the Groups IVa, Va and VIa of the Periodic Table by bringing said non-oxide layer into contact with a gas mixture used for forming said non-oxide layer at 950 to 1020° C. for 1 to 10 minutes after removing one gas component therefrom, and further with said gas mixture with one component removed at 950 to 1020° C. for 1 to 30 minutes after adding $CO_2$ gas in an amount of 0.5 to 1.5 volume % based on said gas mixture with one component removed; and (3) forming on said bonding layer an oxide layer which is substantially $\alpha$-$Al_2O_3$.

DETAILED DESCRIPTION OF THE INVENTION

Figure 1:
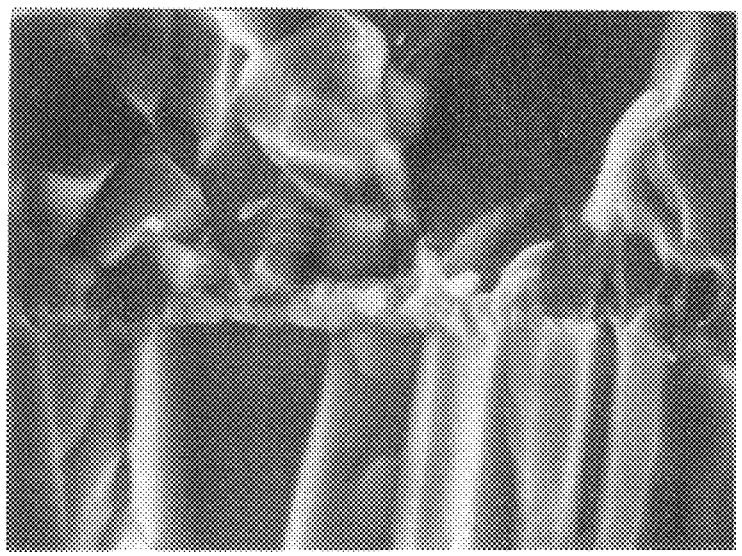
FIG. 1 is a scanning electron microscope (SEM) micrograph at 20000× magnification showing the cross sectional view of the refractory layers of the alumina coated tool according to the invention.

According to the present invention, there is provided an alumina coated tool comprising a substrate body such as a cemented carbide, a high speed steel, a special steel, etc. and a wear resistant refractory layer structure deposited thereon. The refractory layers comprise, at least, an non-oxide layer in contact with the substrate body, a bonding layer on the non-oxide layer and an oxide layer deposited on the bonding layer, each layer being a single-layered or a multi-layered structure.

The non-oxide layer may be at least one of carbide, nitride and carbonitride of a metal selected from the Groups IVa, Va and VIa of the Periodic Table. The non-oxide layer may be a single-layered structure or a multi-layered structure of the carbide, nitride and carbonitride, and may be deposited on the substrate body by the known methods such as chemical vapor deposition, etc. under usual conditions to have a total thickness of about 1 to 20 $\mu$m.

The oxide layer may be $\alpha$-$Al_2O_3$, a mixture of $\alpha$-$Al_2O_3$ and $\kappa$-$Al_2O_3$, a mixture of $\alpha$-$Al_2O_3$ and $ZrO_2$, etc., and preferably those comprising mainly $\alpha$-$Al_2O_3$. The term "mainly" or "substantially" referred to herein means that the $\alpha$-$Al_2O_3$ content is at least 80% by volume of the oxide layer. The content is usually determined by a peak area ratio of major peaks assigned to $\alpha$-$Al_2O_3$, $\kappa$-$Al_2O_3$, etc. in X-ray diffraction pattern, or by measuring the size of each grain on TEM micrograph. The thickness of the oxide layer is usually about to 0.5 to 7 $\mu$m, and the grain size of the oxide layer is preferably 0.5 to 4 $\mu$m.

The bonding layer may be a single layered or a multi-layered structure of at least one of oxide, oxycarbide, oxynitride and oxycarbonitride of a metal selected from the Groups IVa, Va and VIa of the Periodic Table. Preferred bonding layer may be a single layer or a multi-layer of TiO, TiCO, TiNO and TiCNO.

The oxygen content in the bonding layer is preferably 1 to 5% by weight to ensure the tight and adhesive bonding of the bonding layer to the non-oxide under layer and the stable deposition of $\alpha$-$Al_2O_3$ on the bonding layer.

The thickness and the grain size are important for the mechanical strength of the bonding layer. In the present invention, the thickness of the bonding layer is 100 to 750 nm, preferably 100 to 500 nm, and the grain size of the bonding layer is 20 to 200 nm, preferably 20 to 170 nm. The grain size is usually determined by averaging the sizes of grains measured on SEM micrograph as shown in FIGS. 1, 2, 8 and 9. When forming the bonding layer having a thickness less than 100 nm, a uniform layer is not obtained or the bonding layer is partially deficient, particularly in producing a large number of coated tools simultaneously. This prevents the bonding layer from acting as the nucleus for the $\alpha$-$Al_2O_3$ deposition and causes the deposition of 40% or more of $\kappa$-$Al_2O_3$ when measured by X-ray diffraction analysis. Also, the lot-to-lot uniformity of the quality is deteriorated. When the thickness is larger than 750 nm, since the mechanical strength of the bonding layer is poor as compared with the non-oxide layer and the oxide layer mainly comprising $\alpha$-$Al_2O_3$, the fracture is likely to occur in the bonding layer during the machining operation.

From a cross sectional micrograph of a transmission electron microscope (TEM) and an electron diffraction pattern of the refractory layers of the present invention, it has been confirmed that the bonding layer has, like the non-oxide layer, a face-centered cubic structure and that an epitaxial relationship is found between the non-oxide layer and the bonding layer. It has been also confirmed that the interfacial portion between the bonding layer and the oxide layer is formed from 500 or less, preferably 200 or less of interplanar spacings. The interplanar spacing referred to herein is a spacing between two adjacent lattice planes having a given orientation determined by a lattice pattern under a transmission electron microscope.

Although it is not completely clear why the alumina coated tool of the present invention has a long durability without causing the flaking of the oxide layer from the non-oxide layer, it is presumed as follows.

The bonding layer and the non-oxide under layer have the same fcc structure and a major part of these layers are in an epitaxial relationship. Therefore, the atoms in the bonding layer and the non-oxide layer are positioned with a minimum deviation, and the crystal lattices are arranged continuously from the non-oxide layer to the bonding layer. With such a structure, the bonding between the non-oxide layer and the bonding layer is presumed to be enhanced.

The epitaxial relationship is not always found between the bonding layer and the oxide layer. However, the interfacial portion of these layers is formed by 500 or less, preferably 200 or less of continuous interplanar spacings in the thickness direction, this enhancing the bonding between the bonding layer and the oxide layer. It is preferred that the greater part of the interfacial portion has such a structure. However, even when a half or more part of the interfacial portion has such a structure, the oxide layer is continuously formed on the bonding layer without causing microporosity and serious defects in the interfacial portion, thereby enhancing the bonding between the bonding layer and the oxide layer. The structure of the alumina coating was determined by X-ray diffractometry (ASTM No. 10-173 for $\alpha$-$Al_2O_3$).

The refractory layers of the present invention may be deposited on the surface of the substrate body by the following method.

In the first method, after the non-oxide layer is formed on the surface of the substrate body by a known method, a reaction gas mixture obtained by adding $CO_2$ gas to a gas mixture used for depositing the non-oxide layer in an amount of 0.5 to 1.5 volume % based on the gas mixture for the non-oxide layer is brought into contact with the surface of the non-oxide layer at 950 to 1020° C. for 1 to 30 minutes under a pressure of 10 to 150 Torr, thereby allowing the bonding layer to epitaxially grow on the non-oxide layer. Then, the oxide layer is depositing on the bonding layer by using a gas mixture, for example, comprising $H_2$ carrier gas, $AlCl_3$ gas and $CO_2$ gas at 980 to 1020° C. according to a known method.

In an alternative method, one reaction gas component which constitutes the bonding layer is added to or removed from the gas mixture used for depositing the non-oxide layer. The one-component-added or one-component-removed gas mixture is brought into contact with the surface of the non-oxide layer at 950 to 1020° C. for 1 to 10 minutes under a pressure of 10 to 150 Torr. Then, $CO_2$ gas is added to the one-component-added or one-component-removed gas mixture in an amount of 0.5 to 1.5 volume % based on the total flow rate of the one-component-added or one-component-removed gas mixture. The $CO_2$-added gas is supplied to the chamber at 950 to 1020° C. for 1 to 30 minutes under a pressure of 10 to 150 Torr to form the bonding layer in an epitaxial relationship to the non-oxide layer. Then, the oxide layer is formed as described above. By these methods, the number of the constituent elements of the bonding layer may be added or removed by one as compared with the number of the constituent elements of the non-oxide layer except for oxygen. This allows the refractory layers to be selected from a wide variety of structures, for example, TiC/TiCNO, TiCN/TiCO, etc.

The deposition of each layer is carried out by a known film-forming method such as a usual chemical vapor deposition (CVD), a plasma assisted chemical vapor deposition (PACVD), etc.

The present invention will be further described while referring to the following Examples which should be considered to illustrate various preferred embodiments of the present invention.

EXAMPLE 1

A substrate made of a cemented carbide for cutting tools having a composition of 72% of WC, 8% of TiC, 11% of (Ta, Nb) C and 9% of Co (% by weight) was placed in a CVD chamber. The surface of the substrate was coated with a 0.3 $\mu$m thick layer of TiN at 900° C. by the chemical vapor deposition using a gas mixture of $H_2$ carrier gas, $TiCl_4$ gas and $N_2$ gas, and then further coated with a 6 $\mu$m thick layer of TiCN at 900° C. by using a gas mixture of $H_2$ carrier gas, $TiCl_4$ gas and $CH_3CN$ gas, thereby forming a non-oxide layer. Next, a gas mixture of $H_2$ carrier gas, $TiCl_4$ gas and $CH_4$ gas was allowed to flow into the CVD chamber in a flow rate of 2,200 cc/min at 980° C. for 5 minutes, and then $CO_2$ gas of 22 cc/min was added to the gas mixture and allowed to flow for additional 5 minutes to form a bonding layer consisting of Ti, C and O. Thereafter, a 2 $\mu$m thick alumina coating was deposited at 1010° C. by using $H_2$ gas, $AlCl_3$ gas and $CO_2$ gas to produce an alumina coated tool (1) of the present invention.

X-ray diffraction analysis showed that the alumina coating was $\alpha$-$Al_2O_3$.

Figure 2:
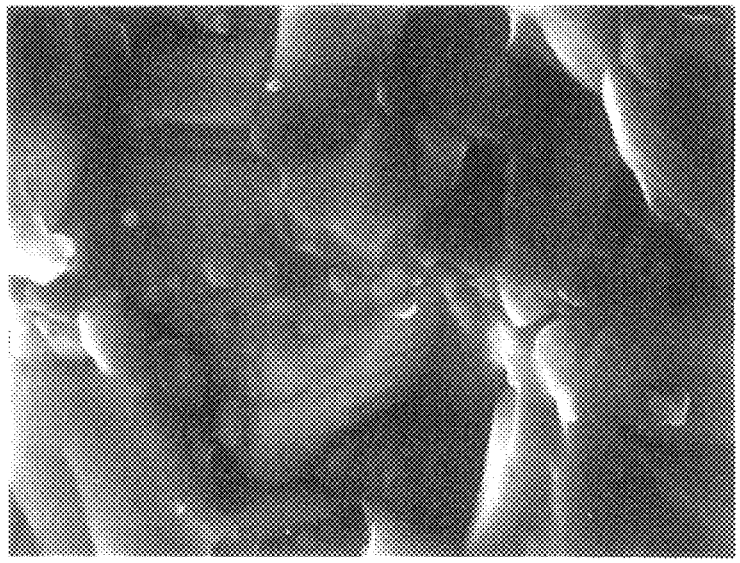
FIG. 2 is an SEM micrograph at 50000× magnification showing the cross sectional view of the refractory layers for the alumina coated tool according to the invention.

FIGS. 1 and 2 are field-emission scanning electron microscope (FE-SEM) photomicrographs at 20000× magnification (FIG. 1) and 50000× magnification (FIG. 2) showing the cross sectional view of the refractory layers on the alumina coated tool (1). As seen from FIGS. 1 and 2, the bonding layer having a thickness of 100 to 500 nm and a grain size of 20 to 160 nm is formed between the alumina uppermost layer and the non-oxide under layer.

Figure 3:
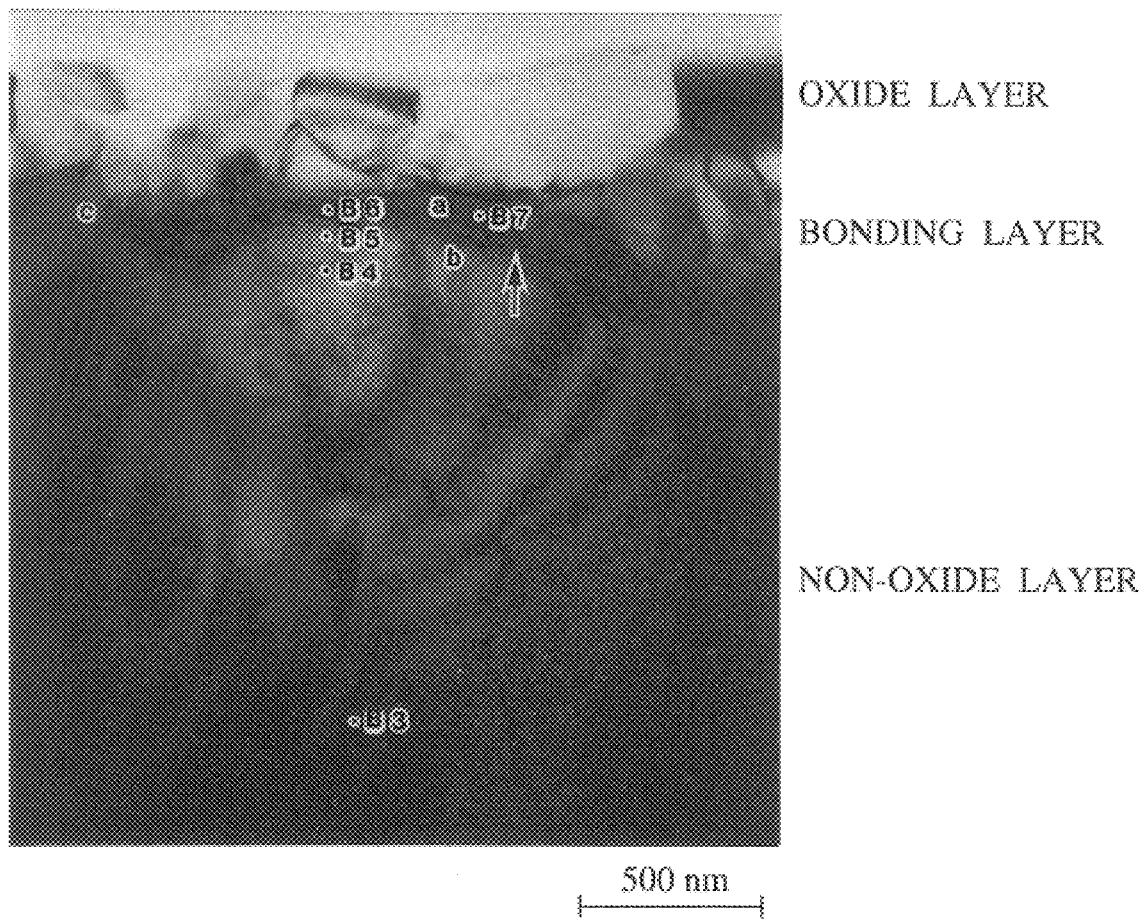
FIG. 3 is a transmission electron microscope (TEM) micrograph showing the cross sectional view of the refractory layers for the alumina coated tool according to the invention.

FIG. 3 is a transmission electron microscope (TEM) photomicrograph of the bonding layer and the vicinity thereof. The bonding layer including B6 and B7 is formed on the TiCN grains (B3, B4 and B5), and the alumina coating is formed on the bonding layer. The energy dispersion X-ray (EDX) analysis of B6 in the bonding layer, B3 and B4 in the non-oxide layer and the coating over B6 showed that the bonding layer contained Ti, C, O and N, the non-oxide under layer contained Ti, C and N, and the coating over B6 contained Al and O. The N content in the bonding layer was very small and presumed to be errors inherent in the method.

Figure 4:
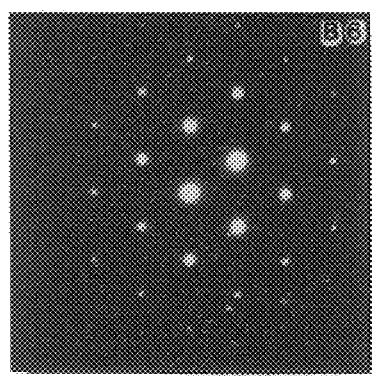
FIG. 4 is an electron diffraction pattern of B6 in the bonding layer shown in FIG. 3.
Figure 5:
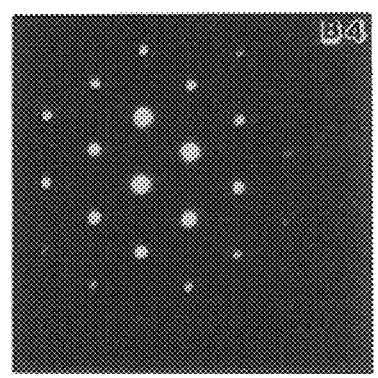
FIG. 5 is an electron diffraction pattern of B4 in the non-oxide under layer shown in FIG. 3.

FIGS. 4 and 5 are electron diffraction patterns of B6 in the bonding layer and B4 in the non-oxide layer shown in FIG. 3. FIGS. 4 and 5 show that the bonding layer and the non-oxide layer have the same fcc structure and that the (110) crystal axes of both layers are normal to the photomicrograph plane. Thus, it is confirmed that there exists an epitaxial relationship between both the layers. The same analysis repeated on other 10 pairs of points in the bonding layer and the non-oxide layer showed that there existed the epitaxial relationship between the bonding layer and the non-oxide layer in 8 pairs of points.

Figure 6:
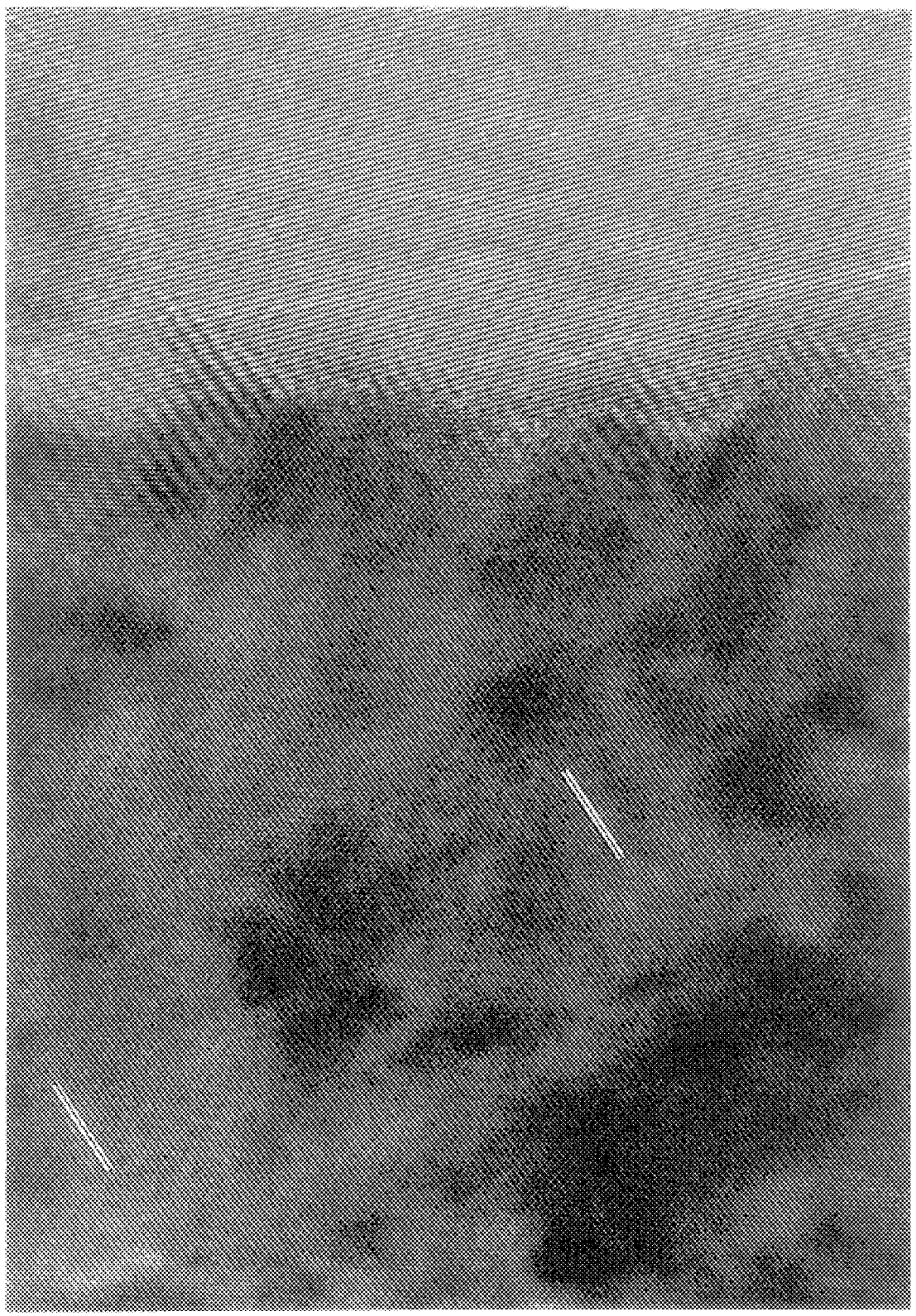
FIG. 6 is an TEM micrograph showing the crystal lattice at the portion (a) shown in FIG. 3.
Figure 7:
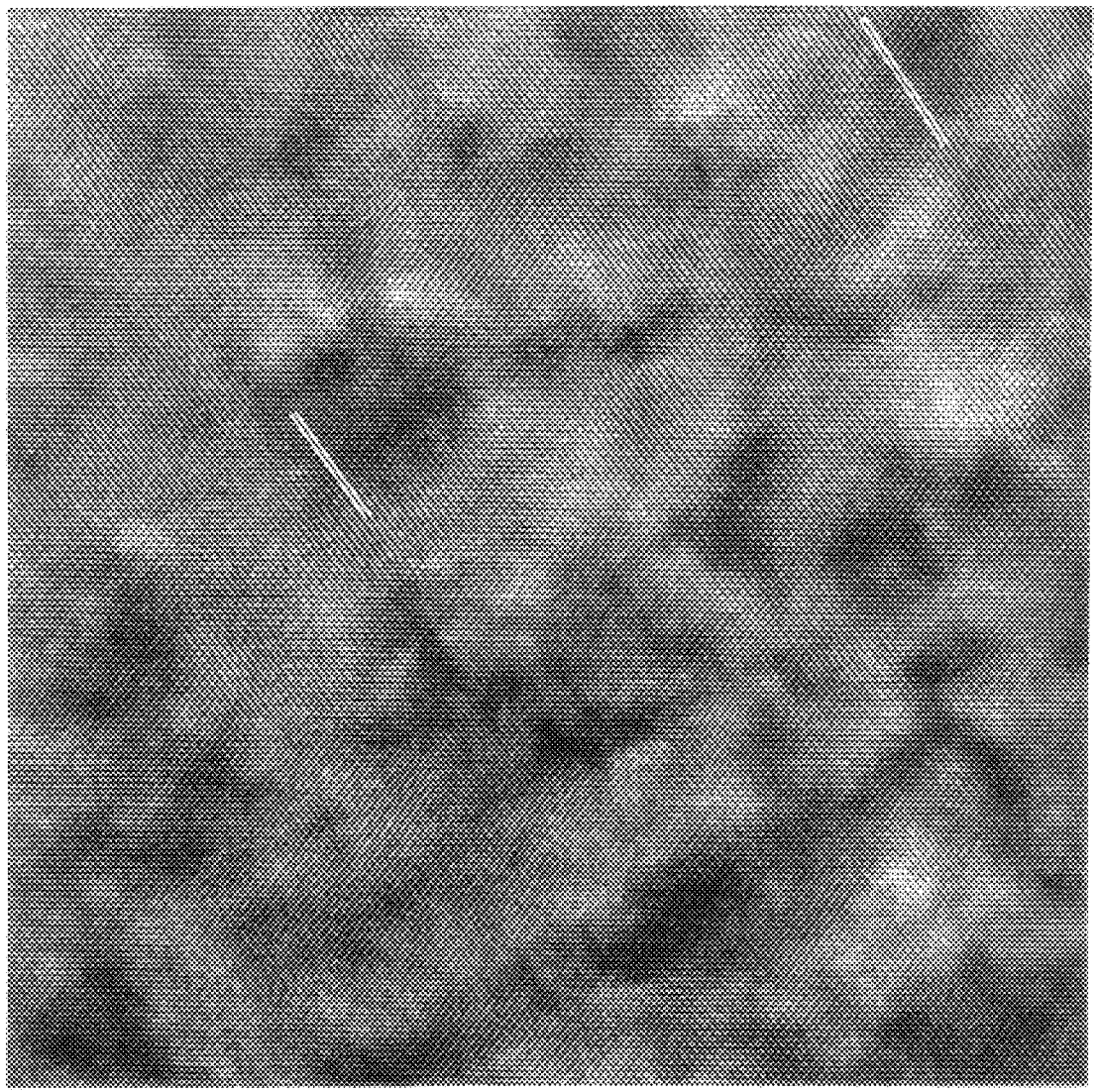
FIG. 7 is an TEM micrograph showing the crystal lattice at the portion (b) shown in FIG. 3.

FIG. 6 is a photomicrograph showing the lattice image of the portion (a) of FIG. 3, namely the lattice image in the vicinity of the interfacial portion of the alumina coating (oxide layer) and the bonding layer (near B6). FIG. 6 includes the oxide layer, the interfacial portion of the oxide layer and the bonding layer and the bonding layer from the upper side to the lower side. FIG. 7 is a photomicrograph showing the lattice image of the portion (b) of FIG. 3, namely the lattice image between the bonding layer and the non-oxide layer of TiCN. Thus, the portions (a) and (b) is nearly continuously shown in FIGS. 6 and 7. As seen from the portion extending from FIG. 6 to FIG. 7, the lattice nearly continuously grows in the region between the bonding layer and the non-oxide layer, and therefore, no clear interface is found between the bonding layer and the non-oxide layer. FIG. 6 shows that the lattice spacing of the (111) planes in the bonding layer is 0.249 nm, and FIG. 7 shows that the lattice spacing of the (111) planes in the non-oxide layer is 0.245 nm. The number of interplanar spacings was calculated from the distance of a hundred (111) lattice planes in FIGS. 6 and 7. Therefore, the figures at the third decimal place may involve errors. However, the obtained spacings are reliable as the relative values.

From the above results, it can be found that the bonding layer comprises TiCO and TiCNO each having a lattice constant of about 0.433 nm, and has the same fcc structure as in the non-oxide under layer. Also, there exists the epitaxial relationship between the bonding layer and the non-oxide layer, and the lattice continuously grows in the region between the bonding layer and the non-oxide layer.

Also, as seen from the upper portion of FIG. 6, the interfacial portion between the bonding layer and the alumina layer is continuously formed by about 50 interplanar spacings.

Five cutting tools (1) were subjected to one-hour continuous cutting operation using a cast product as the workpiece under the following conditions. After the operation, the occurrence and degree of flaking of the alumina coating was examined under an optical microscope at 200× magnification.

Workpiece: FC25 (Brinell hardness: HB 230)
Cutting speed: 100 m/min
Feed: 0.3 mm/rev
Cutting depth: 2.0 mm
Water-soluble cutting fluid was used.

As a result of the one-hour continuous cutting test, the cutting tools of the present invention were found to be suitable for use in machining operation because no flaking of the alumina coating was observed in any of the five tools.

Other five cutting tools were subjected to an intermittent cutting operation. After 1000 times impact cutting, the occurrence and degree of flaking at the cutting edge was examined under a stereoscopic microscope at 50× magnification.

Workpiece: SCM
Cutting speed: 100 m/min
Feed: 0.3 mm/rev
Cutting depth: 2.0 mm

Any of the five cutting tools showed no flaking at the cutting edge and were used for a long period of time.

COMPARATIVE EXAMPLE 1

In the same manner as in Example 1, the surface of the substrate of the same type was coated with a 0.3 $\mu$m thick layer of TiN at 900° C. by using a gas mixture of $H_2$ carrier gas, $TiCl_4$ gas and $N_2$ gas and a 6 $\mu$m thick layer of TiCN at 900° C. by using a gas mixture of $H_2$ carrier gas, $TiCl_4$ gas and $CH_3CN$ gas to form a non-oxide layer. Then the surface of the non-oxide layer of TiCN was oxidized by contacting the surface with a gas mixture containing $H_2$ carrier gas and a small amount of $CO_2$ gas at 980° C. for 10 minutes to produce a bonding layer. Thereafter, a 2 μm thick alumina coating was deposited in the same manner as in Example 1 to produce a comparative cutting tool. X-ray diffraction analysis showed that the alumina coating was $\alpha\text{-}Al_2O_3$.

Five comparative cutting tools thus produced were subjected to the same continuous cutting operation as in Example 1, and the flaking of the alumina coating was observed under an optical microscope at 200× magnification. The flaking of the alumina coating occurred in any of the comparative cutting tools after 10 minutes of the cutting operation.

Separately, other five comparative cutting tools were subjected to the same intermittent cutting operation as in Example 1, and the cutting edge was observed with respect to the occurrence of the flaking under a stereoscopic microscope at 50× magnification after 1000 times impact cutting. As a result, the comparative cutting tools were found to be not suitable because a serious flaking at the cutting edge occurred in any of the cutting tools.

EXAMPLE 2

Figure 8:
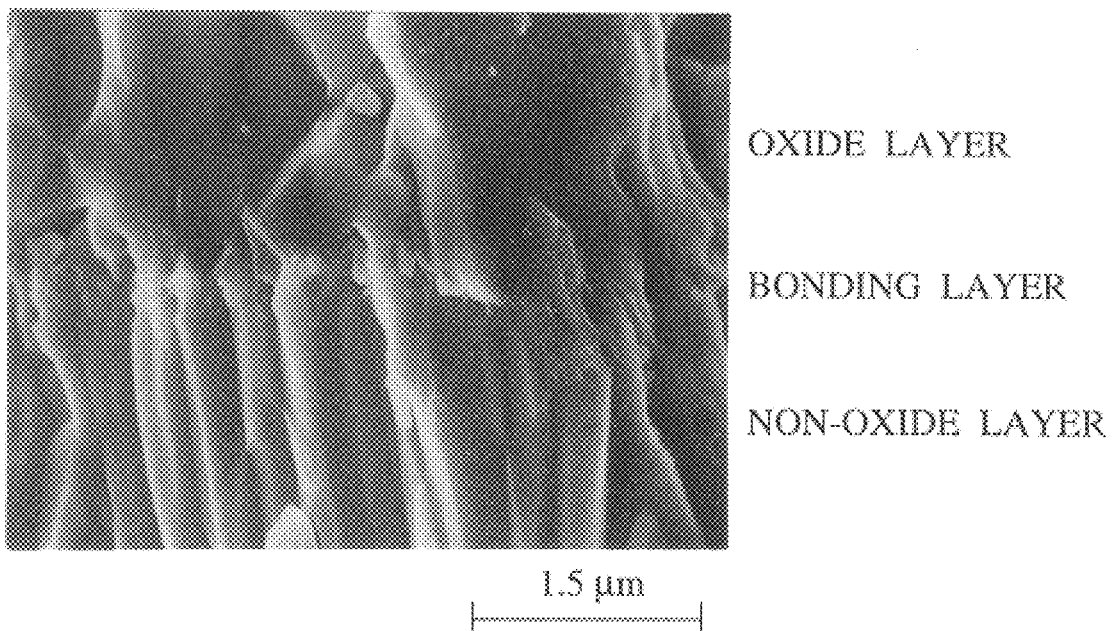
FIG. 8 is an SEM micrograph showing the cross sectional view of the refractory layers for the alumina coated tool according to the invention.
Figure 9:
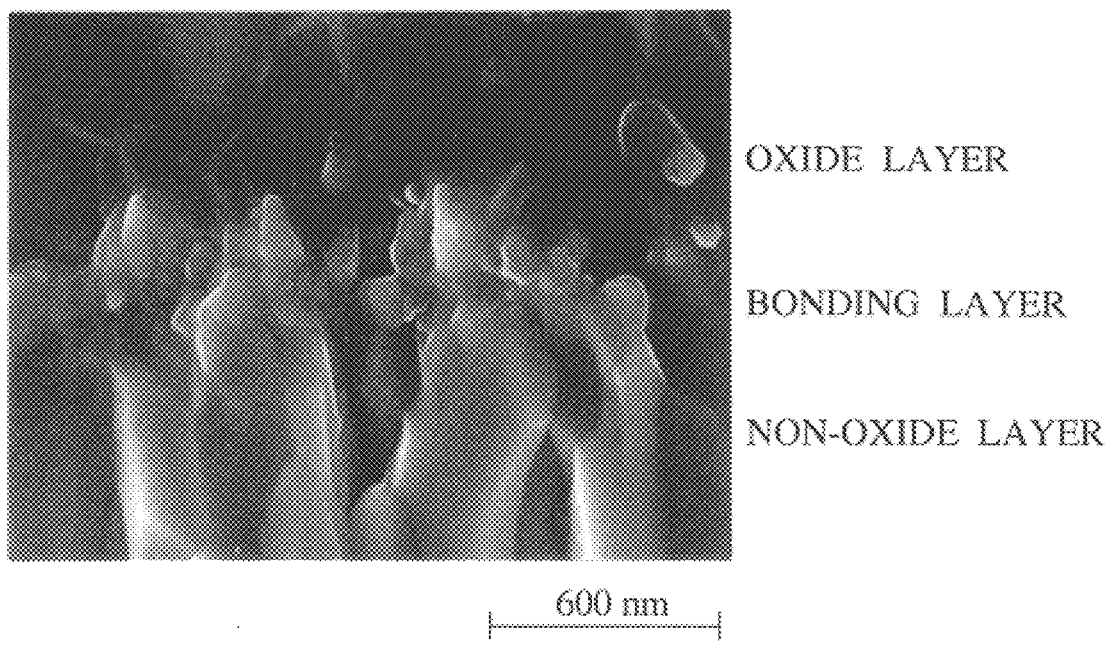
FIG. 9 is an SEM micrograph showing the cross sectional view of the refractory layers for the alumina coated tool according to the invention.

The surface of the substrate of the same type as in Example 1 was coated with a 0.3 μm thick layer of TiN at 910° C. by using a gas mixture of $H_2$ carrier gas, $TiCl_4$ gas and $N_2$ gas, and then further coated with a 6 μm thick layer of TiCN at 990° C. by using a gas mixture of $H_2$ carrier gas, $TiCl_4$ gas, $N_2$ gas and $CH_4$ gas, thereby forming a non-oxide layer. Then, a bonding layer of Ti, C, N and O was formed at 990° C. for 20 minutes by using a gas mixture of $H_2$ carrier gas, $TiCl_4$ gas, $N_2$ gas and $CH_4$ gas added with $CO_2$ gas in an amount of 1.5 volume % of the total flow rate of $H_2$ carrier gas, $TiCl_4$ gas, $N_2$ gas and $CH_4$ gas. Thereafter, a 3 μm thick alumina layer was formed at 1020° C. by using a gas mixture of $H_2$ gas, $AlCl_3$ gas and $CO_2$ gas to produce an alumina coated tool (2) of the present invention. X-ray diffraction analysis showed that the alumina coating was $\alpha\text{-}Al_2O_3$. FIGS. 8 and 9 are FE-SEM photomicrograph taken in the same manner as in FIGS. 1 and 2 respectively. As seen from FIGS. 8 and 9, the bonding layer having a thickness of 250 to 550 nm and a grain size of 40 to 160 nm is formed between the alumina uppermost layer and the non-oxide under layer.

The TEM/EDX analysis of around the bonding layer showed that the bonding layer consisted of Ti, C, N and O, and the non-oxide under layer consisted of Ti, C and N. Also, it was found that the bonding layer and the non-oxide layer have the same fcc structure and that the (110) crystal axes of both layers are normal to the photomicrograph plane. Further, the lattice nearly continuously grew in the region between the bonding layer and the non-oxide layer of TiCN. From these results, it would appear that the bonding layer is TiCNO having the same fcc structure as TiCN in the non-oxide layer and an epitaxial relationship is found between both the layers. Observation on ten different pairs of points, one of the points in the bonding layer and the other in the non-oxide layer and both in contact with each other, showed that there existed an epitaxial relationship in nine pairs of points.

Figure 10:
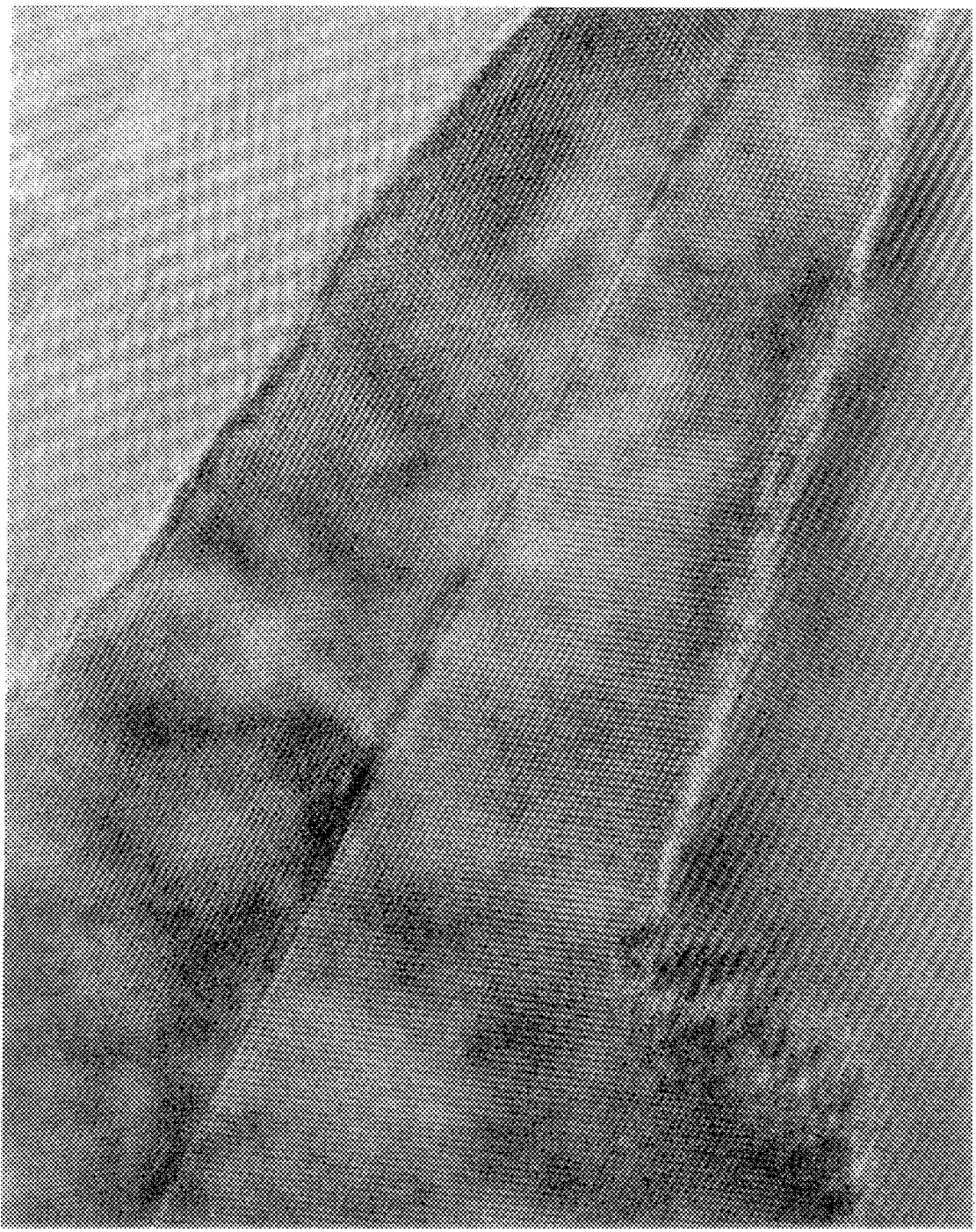
FIG. 10 is an TEM micrograph showing the crystal lattice around the interfacial portion of the bonding layer and the alumina layer of the coating obtained in Example 2.

FIG. 10 is a TEM photomicrograph showing the interfacial portion of the bonding layer and the alumina layer. The upper direction of FIG. 10 indicates the upper direction of the coating. In the middle portion of FIG. 10, the lattice planes of the bonding layer are found and the lattice planes of alumina are found in both the side thereof. The interfacial potion of the bonding layer and the right side alumina layer constituted by 6 to 30 interplanar spacings, and the interfacial potion of the bonding layer and the left side alumina layer constituted by 6 to 20 interplanar spacings.

Five coated tools thus produced were subjected to the same continuous cutting operation as in Example 1. After one hour of the cutting operation, the occurrence and degree of flaking of the alumina coating was examined under an optical microscope at 200× magnification. The flaking of the alumina coating did not occurred in any of the coated tools even after one hour of the cutting operation.

Separately, other five coated tools produced in the same manner as above were subjected to the same intermittent cutting operation as in Example 1, and the cutting edge was examined with respect to the occurrence and degree of the flaking under a stereoscopic microscope at 50× magnification after 1000 times impact cutting. As a result, the coated tools were found to be suitable because no flaking at the cutting edge occurred in any of the coated tools.

EXAMPLE 3

The surface of the substrate of the same type as in Example 1 was coated with a 0.5 μm thick layer of TiC and a 6 μm thick layer of TiCN, thereby forming a non-oxide layer. Then, a bonding layer of Ti, N and P was formed at 1000° C. for 20 minutes by using a gas mixture of $H_2$ carrier gas, $TiCl_4$ gas and $N_2$ gas added with $CO_2$ gas in an amount of 0.5 volume % of the total flow rate of $H_2$ carrier gas, $TiCl_4$ gas and $N_2$ gas. Thereafter, a 3 μm thick alumina layer was formed at 1005° C. by using a gas mixture of $H_2$ gas, $AlCl_3$ gas and $CO_2$ gas to produce an alumina coated tool (3) of the present invention. X-ray diffraction analysis showed that the alumina coating was a mixture of $\alpha\text{-}Al_2O_3$ and $\kappa\text{-}Al_2O_3$ containing 80% or more of $\alpha\text{-}Al_2O_3$. From the same FE-SEM observation and the same TEM and EDX analysis as in Examples 1–2, it was confirmed that the bonding layer was constituted by Ti, N and O and had a thickness of 450 to 750 nm and a grain size of 40 to 120 nm. Also confirmed was that the bonding layer and the non-oxide under layer had the same fcc structure and an epitaxial relationship was found between the layers.

Five coated tools thus produced were subjected to the same continuous cutting operation as in Example 1. After one hour of the cutting operation, the occurrence and degree of flaking of the alumina coating was observed under an optical microscope at 200× magnification. The flaking of the alumina coating did not occurred in any of the coated tools even after one hour of the cutting operation.

Separately, other five coated tools produced in the same manner as above were subjected to the same intermittent cutting operation as in Example 1, and the cutting edge was observed with respect to the occurrence and degree of the flaking under a stereoscopic microscope at 50× magnification after 1000 times impact cutting. As a result, the coated tools were found to be suitable because no flaking at the cutting edge occurred in any of the coated tools.

EXAMPLE 4

The surface of the substrate of the same type as in Example 1 was successively coated with TiC layer, TiN layer, TiC layer and TiN layer in this order, each having a thickness of 1.5 μm. Then, a bonding layer of Ti and O was formed at 960° C. for 20 minutes by using a gas mixture of $H_2$ carrier gas and $TiCl_4$ gas added with $CO_2$ gas in an amount of 0.7 volume % of the total flow rate of $H_2$ carrier gas and $TiCl_4$ gas. Thereafter, a 3 μm thick alumina layer was formed at 1015° C. by using a gas mixture of $H_2$ gas, $AlCl_3$ gas and $CO_2$ gas to produce an alumina coated tool (4)

of the present invention. X-ray diffraction analysis showed that the alumina coating was $\alpha$-$Al_2O_3$.

From the same FE-SEM observation and the same TEM and EDX analysis as in Example 1, it was confirmed that the bonding layer was constituted by Ti and O and had a thickness of 300 to 600 nm and a grain size of 50 to 200 nm. Also confirmed was that the bonding layer and the non-oxide under layer had the same fcc structure and an epitaxial relationship was found between the layers.

Five coated tools thus produced were subjected to the same continuous cutting operation as in Example 1. After one hour of the cutting operation, the occurrence and degree of flaking of the alumina coating was observed under an optical microscope at 200× magnification. The flaking of the alumina coating did not occurred in any of the coated tools even after one hour of the cutting operation.

Separately, other five coated tools produced in the same manner as above were subjected to the same intermittent cutting operation as in Example 1, and the cutting edge was observed with respect to the occurrence of the flaking under a stereoscopic microscope at 50× magnification after 1000 times impact cutting. As a result, the coated tools were found to be suitable because no flaking at the cutting edge occurred in any of the coated tools.

As described above, in the present invention, an fcc bonding layer comprising a single-coating or a multi-coating of at least one of oxide, oxycarbide, oxynitride and oxycarbonitride of a metal selected from the group consisting of the Groups IVa, Va and VIa of the Period Table is formed between the oxide layer mainly comprising $\alpha$-$Al_2O_3$ and the non-oxide under layer of at least one of carbide, nitride and carbonitride of a metal selected from the group consisting of the Groups IVa, Va and VIa of the Periodic Table, in particular, TiN, TiCN, TiC, etc. The intervening bonding layer enhances the bonding between the oxide layer and the non-oxide under layer to provide a coated tool having a good bonding strength of the oxide layer to the non-oxide under layer, a high resistance to flaking, and long life.

What is claimed is:

1. An alumina coated tool having a plurality of refractory layers on a substrate body, wherein said plurality of refractory layers comprises:

a non-oxide layer of at least one of carbide, nitride and carbonitride of a metal selected from the group consisting of the Groups IVa, Va and VIa of the Periodic Table, said non-oxide layer being deposited on a surface of said substrate body;

a bonding layer having a face-centered-cubic structure and comprising a single-coating or a multi-coating of at least one of oxide, oxycarbide, oxynitride, oxycarbonitride of a metal selected from the group consisting of the Groups IVa, Va and VIa of the Periodic Table, said bonding layer being deposited on said non-oxide layer; and an oxide layer being substantially $\alpha$-$Al_2O_3$, said oxide layer being deposited on said bonding layer.

2. The alumina coated tool according to claim 1, wherein said non-oxide layer and said bonding layer are in an epitaxial relationship to each other.

3. The alumina coated tool according to claim 1, wherein there is an interfacial portion between said bonding layer and said oxide layer, said interfacial portion having a thickness corresponding to 500 times or less an interplanar spacing of lattice pattern of each of said bonding layer and said oxide layer.

4. The alumina coated tool according to claim 1, wherein said bonding layer is a single-coating or a multi-coating of at least one of TiO, TiCO, TiNO and TiCNO.

5. The alumina coated tool according to claim 1, wherein a thickness of said bonding layer is 100 to 750 nm.

6. The alumina coated tool according to claim 1, wherein a grain size of said bonding layer is 20 to 200 nm.

* * * * *